United States Patent
Gaudet et al.

(10) Patent No.: US 11,697,584 B2
(45) Date of Patent: Jul. 11, 2023

(54) MULTIDIRECTIONAL TRANSLATING AND TILTING PLATFORM USING BENDING ACTUATORS AS ACTIVE ENTITY

(71) Applicant: Fraunhofer-Gesellschaft zur Foerderung der angewandten Forschung e.V., Munich (DE)

(72) Inventors: Matthieu Gaudet, Dresden (DE); Bert Kaiser, Dresden (DE)

(73) Assignee: Fraunhofer-Gesellschaft zur Foerderung der angewandten Forschung e.V., Munich (DE)

(*) Notice: Subject to any disclaimer, the term of this patent is extended or adjusted under 35 U.S.C. 154(b) by 345 days.

(21) Appl. No.: 16/799,293

(22) Filed: Feb. 24, 2020

(65) Prior Publication Data
US 2020/0189907 A1 Jun. 18, 2020

Related U.S. Application Data

(63) Continuation of application No. PCT/EP2018/073105, filed on Aug. 28, 2018.

(30) Foreign Application Priority Data

Aug. 31, 2017 (DE) ...................... 10 2017 215 276.1

(51) Int. Cl.
*B81B 3/00* (2006.01)
(52) U.S. Cl.
CPC ...... *B81B 3/0062* (2013.01); *B81B 2201/034* (2013.01); *B81B 2203/01* (2013.01);
(Continued)
(58) Field of Classification Search
CPC ............ B81B 3/0062; B81B 2201/034; B81B 2203/01; B81B 2203/0145;
(Continued)

(56) References Cited

U.S. PATENT DOCUMENTS

| 5,834,864 A | * | 11/1998 | Hesterman | G01Q 10/04 360/78.12 |
| 6,541,892 B2 | * | 4/2003 | Hoen | H02N 1/008 310/309 |

(Continued)

FOREIGN PATENT DOCUMENTS

| CN | 1881004 A | 12/2006 |
| CN | 1982939 A | 6/2007 |

(Continued)

OTHER PUBLICATIONS

Kim, Y-S , et al., "Design of MEMS based three-axis motion stage by incorporating a nested structure", Journal of Micromechanics & Microengineering, vol. 24, No. 7, Jun. 6, 2014, p. 075009, XP055536435, GB ISSN: 0960-1317, DOI: 10.1088/0960-1317/24/7/075009, Jun. 6, 2014.

(Continued)

*Primary Examiner* — Bernard Rojas
(74) *Attorney, Agent, or Firm* — Perkins Coie LLP; Michael A. Glenn

(57) ABSTRACT

A platform includes first and second actuation layers. The first actuation layer includes first and second frames and a plurality of actuators connected between the first frame and the second frame, wherein the plurality of actuators are adapted to move the first and second frames with respect to each other in a first direction. The second actuation layer includes third and fourth frames and a plurality of actuators connected between the third frame and the fourth frame, wherein the plurality of actuators are adapted to move the third frame and the fourth frame with respect to each other in a second direction, different from the first direction. Thereby, the fourth frame of the second actuation layer and the second frame of the first actuation layer are mechanically connected to each other, such that the second actuation layer
(Continued)

experiences the movement in the first direction induced by the first actuation layer.

13 Claims, 7 Drawing Sheets

(52) U.S. Cl.
CPC . *B81B 2203/0145* (2013.01); *B81B 2203/056* (2013.01); *B81B 2203/058* (2013.01)

(58) Field of Classification Search
CPC ........ B81B 2203/056; B81B 2203/058; B81B 2201/031; B81B 2201/032; B81B 2201/047; G02B 7/08; G02B 7/023; G02B 27/646
See application file for complete search history.

(56) References Cited

U.S. PATENT DOCUMENTS

| | | | | |
|---|---|---|---|---|
| 6,806,991 | B1 * | 10/2004 | Sarkar | G01Q 10/04 359/290 |
| 2002/0038984 | A1 | 4/2002 | Jeong et al. | |
| 2002/0125789 | A1 | 9/2002 | Brandt | |
| 2005/0035682 | A1 | 2/2005 | Tsuboi et al. | |
| 2006/0284514 | A1 | 12/2006 | Ko et al. | |
| 2008/0013132 | A1 | 1/2008 | Kang | |
| 2010/0017921 | A1 | 1/2010 | Rangelow et al. | |
| 2012/0075685 | A1 | 3/2012 | Hofmann et al. | |
| 2012/0133242 | A1 | 5/2012 | Njikam et al. | |
| 2012/0230079 | A1 | 9/2012 | Li et al. | |
| 2013/0301101 | A1 | 11/2013 | Conrad et al. | |
| 2015/0212526 | A1 | 7/2015 | Kanemoto et al. | |

FOREIGN PATENT DOCUMENTS

| | | |
|---|---|---|
| CN | 102712460 A | 10/2012 |
| CN | 104807453 A | 7/2015 |
| CN | 106132867 A | 11/2016 |
| DE | 102007005293 A1 | 8/2008 |
| DE | 102008003344 A1 | 7/2009 |
| EP | 2664058 B1 | 5/2017 |
| WO | 0195014 A1 | 12/2001 |
| WO | 2009086976 A2 | 7/2009 |
| WO | 2017079298 A1 | 5/2017 |

OTHER PUBLICATIONS

Liu, Xinyu , et al., "A MEMS stage for 3-axis nanopositioning", Journal of Micromechanics & Microengineering, Institute of Physics Publishing, Bristol, GB, vol. 17, No. 9, Sep. 1, 2007, pp. 1796-1802, XP020120224, ISSN: 0960-1317, DOI:, Sep. 1, 2007.

* cited by examiner layer associated to Ox displacement area dedicated to actuators in layer 1 layer associated to Oy displacement area dedicated to actuators in layer 2

MULTIDIRECTIONAL TRANSLATING AND TILTING PLATFORM USING BENDING ACTUATORS AS ACTIVE ENTITY

CROSS-REFERENCE TO RELATED APPLICATIONS

This application is a continuation of copending International Application No. PCT/EP2018/073105, filed Aug. 28, 2018, which is incorporated herein by reference in its entirety, and additionally claims priority from German Application No. DE 10 2017 215 276.1, filed Aug. 31, 2017, which is incorporated herein by reference in its entirety.

Embodiments relate to translating and/or tilting platform. Some embodiments relate to a multidirectional translating and tilting platform having bending actuators as active entity.

BACKGROUND OF THE INVENTION

Several different MEMS-based (MEMS=micro-electromechanical systems) bending actuators are known from the literature. For example, nanoscopic electrostatic drive (NED) actuators are known from the EP 2 664 058 B1. NED actuators are MEMS-based bending actuators, that work like bimorph actuators (piezoelectric or thermomechanical effect). They are made with surface micromachining (V-NED) or bulk micromachining (L-NED) on or within silicon wafer substrates. V-NED actuators enable a vertical deflection (out-of-plane movement), wherein L-NED actuators enable a lateral deflection (in-plane movement).

MEMS-based bending actuators can be used for a variety of applications, such as quasi-static tilting mirrors, micropumps and MEMS-based loudspeakers.

SUMMARY

According to an embodiment, a platform may have: a first actuation layer including a first frame, a second frame and a plurality of actuators connected between the first frame and the second frame, wherein the plurality of actuators are adapted to move the first frame and the second frame with respect to each other in a first direction; a second actuation layer including a third frame, a fourth frame and a plurality of actuators connected between the third frame and the fourth frame, wherein the plurality of actuators are adapted to move the third frame and the fourth frame with respect to each other in a second direction, different from the first direction; wherein the fourth frame of the second actuation layer and the second frame of the first actuation layer are mechanically connected to each other; wherein the first actuation layer includes first auxiliary frame structures mechanically connected to the first frame and second auxiliary frame structures mechanically connected to the second frame, wherein the plurality of actuators are mechanically connected between the first auxiliary frame structures and the second auxiliary frame structures, and/or wherein the second actuation layer includes third auxiliary frame structures mechanically connected to the third frame and fourth auxiliary frame structures mechanically connected to the fourth frame, wherein the plurality of actuators are mechanically connected between the third auxiliary frame structures and the fourth auxiliary frame structures.

Embodiments provide a platform comprising a first actuation layer and a second actuation layer. The first actuation layer comprises a first frame, a second frame and a plurality of actuators connected between the first frame and the second frame, wherein the plurality of actuators are adapted to move the first frame and the second frame with respect to each other in a first direction. The second actuation layer comprises a third frame, a fourth frame and a plurality of actuators connected between the third frame and the fourth frame, wherein the plurality of actuators are adapted to move the third frame and the fourth frame with respect to each other in a second direction, different from the first direction. Thereby, the fourth frame of the second actuation layer and the second frame of the first actuation layer are mechanically connected to each other, such that the second actuation layer experiences the movement in the first direction induced by the first actuation layer.

Subsequently, advantageous implementations of the platform are described.

In embodiments, the actuators of the first actuation layer and the second actuation layer are nanoscopic electrostatic drive (NED) actuators.

In embodiments, the first direction can be an in-plane direction in a plane spanned by the first actuation layer. For example, the in-plane direction can be a direction parallel to the plane spanned by the first actuation layer In embodiments, the second direction can be an in-plane direction in a plane spanned by the second actuation layer. For example, the in-plane direction can be a direction parallel to the plane spanned by the second actuation layer In embodiments, the second direction can be an out-of-plane direction out of a plane spanned by the second actuation layer. For example, the out-of-plane direction can be a rotation of the third frame and the fourth frame with respect to each other, e.g., around an axis parallel to the plane spanned by the second actuation layer. For example, the out-of-plane direction can be a vertical translation of the third frame and the fourth frame with respect to each other, e.g., perpendicular to the plane spanned by the second actuation layer.

In embodiments, the first frame can be a static or fixed frame, wherein the second frame, third frame and the fourth frame can be moveable frames.

In embodiments, the first actuation layer and the second actuation layer are stacked on each other.

In embodiments, the plurality of actuators of the first actuation layer can be formed by two groups of actuators, wherein the two groups of actuators can be adapted to rotate the first frame and the second frame with respect to each other.

In embodiments, the plurality of actuators of the second actuation layer can be formed by two groups of actuators, wherein the two groups of actuators can be adapted to rotate the first frame and the second frame with respect to each other.

In embodiments, the platform can comprise a third actuation layer comprising a fifth frame, a sixth frame and actuators connected between the fifth frame and the sixth frame, wherein the actuators can be adapted to move the fifth frame and the sixth frame with respect to each other in a third direction, different from the first direction and the second direction, wherein the fifth frame of the third actuation layer can be mechanically connected to the third frame of the second actuation layer.

In embodiments, the actuators of the third actuation layer can be nanoscopic electrostatic drive (NED) actuators.

In embodiments, the third direction can be an out-of-plane direction out of a plane spanned by the third actuation layer. For example, the out-of-plane direction can be a rotation of the fifth frame and the sixth frame with respect to each other, e.g., around an axis parallel to the plane spanned by the third actuation layer. For example, the out-of-plane direction can be a vertical translation of the fifth frame and the sixth frame with respect to each other, e.g., perpendicular to the plane spanned by the third actuation layer.

In embodiments, the first actuation layer, the second actuation layer and the third actuation layer can be stacked on each other.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
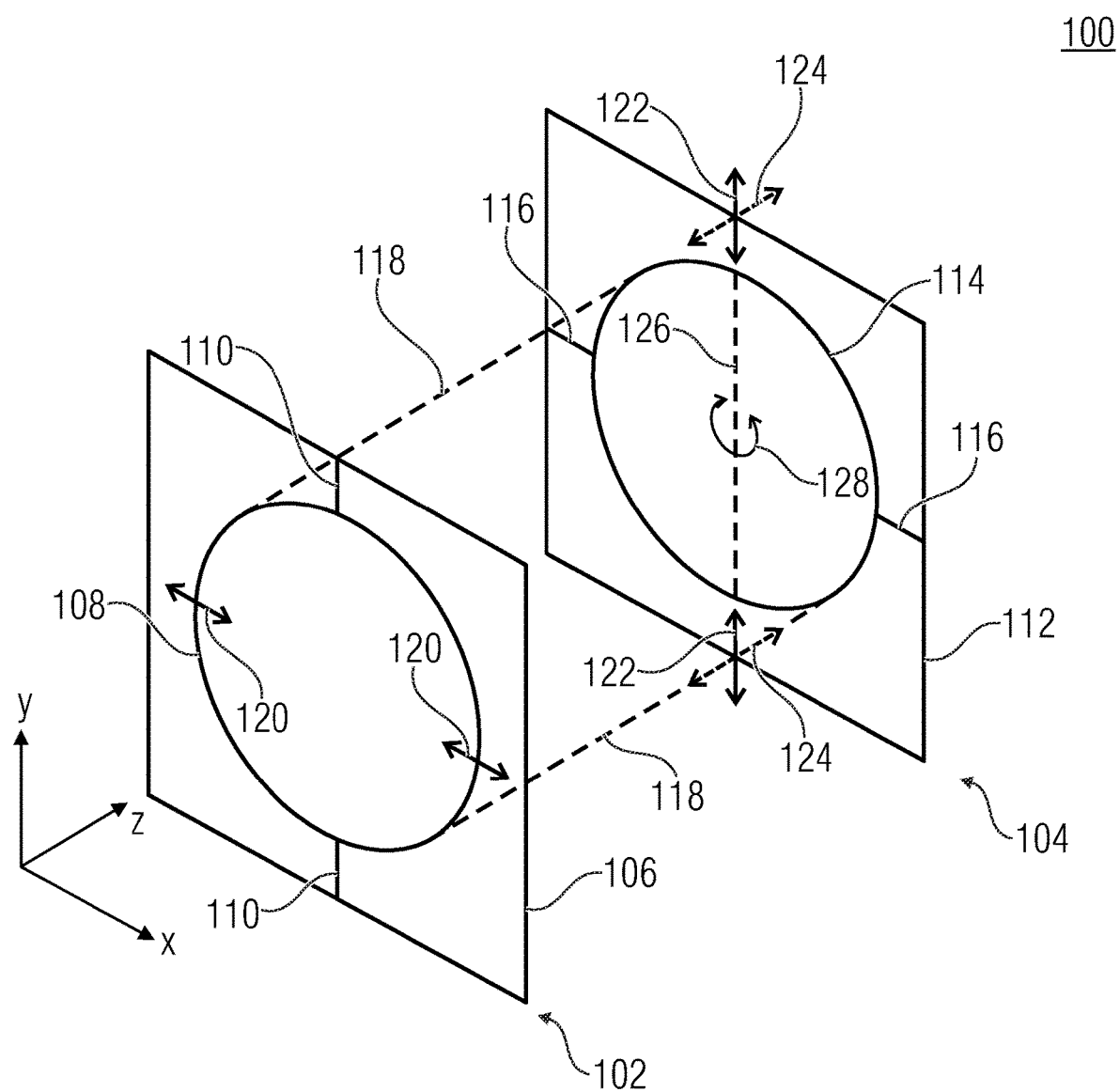
FIG. 1 shows a schematic, exploded view of a platform with a first actuation layer and a second actuation layer, according to an embodiment.

Equal or equivalent elements or elements with equal or equivalent functionality are denoted in the following description by equal or equivalent reference numerals.

In the following description, a plurality of details are set forth to provide a more thorough explanation of embodiments of the present invention. However, it will be apparent to one skilled in the art that embodiments of the present invention may be practiced without these specific details. In other instances, well-known structures and devices are shown in block diagram form rather than in detail in order to avoid obscuring embodiments of the present invention. In addition, features of the different embodiments described hereinafter may be combined with each other, unless specifically noted otherwise.

FIG. 1 shows a schematic, exploded view of a platform 100 with a first actuation layer 102 and a second actuation layer 104, according to an embodiment.

The first actuation layer 102 comprises a first frame 106, a second frame 108 and a plurality of actuators 110 connected between the first frame 106 and the second frame 108, wherein the plurality of actuators 110 are adapted to move the first frame 106 and the second frame 108 with respect to each other in a first direction.

The second actuation layer 104 comprises a third frame 112, a fourth frame 114 and a plurality of actuators 116 connected between the third frame 112 and the fourth frame 114, wherein the plurality of actuators 116 are adapted to move the third frame 112 and the fourth frame 114 with respect to each other in a second direction, different from the first direction.

Thereby, the fourth frame 114 of the second actuation layer 104 and the second frame 108 of the first actuation layer 102 can be mechanically connected to each other (indicated by the doted lines 118 in FIG. 1), such that the second actuation layer 104 experiences the movement in the first direction induced by the first actuation layer 120.

FIG. 1 further shows for illustration and explanation purposes a Cartesian coordinate system having a first axis (e.g., x-axis), a second axis (e.g., y-axis) and a third axis (e.g., z-axis) perpendicular to each other.

In embodiments, the first direction can be an in-plane direction in a plane spanned by the first actuation layer 102. The in-plane direction can be a direction parallel to the plane spanned by the first actuation layer 102. Referring to FIG. 1, the plane spanned by the first actuation layer 102 can be, for example, a plane parallel to a plane spanned by the first axis (e.g., x-axis) and the second axis (e.g., y-axis) of the Cartesian coordinate system.

For example, the actuators 110 of the first actuation layer 102 can be configured to move (e.g., to translate) the first frame 106 and the second frame 108 with respect to each other parallel to the plane spanned by the first actuation layer 102, e.g., in the first direction parallel to the first axis (e.g., x-axis) of the Cartesian coordinate system, as indicated in FIG. 1 by way of example by the arrows 120.

In embodiments, the second direction can be an in-plane direction in a plane spanned by the second actuation layer 104. The in-plane direction can be a direction parallel to the plane spanned by the second actuation layer 104. Referring to FIG. 1, the plane spanned by the second actuation layer 104 can be, for example, a plane parallel to a plane spanned by the first axis (e.g., x-axis) and the second axis (e.g., y-axis) of the Cartesian coordinate system.

For example, the actuators 116 of the second actuation layer 104 can be configured to move (e.g., to translate) the third frame 112 and the fourth frame 114 with respect to each other parallel to the plane spanned by the second actuation layer 104, e.g., in the second direction parallel to the second axis (e.g., y-axis) of the Cartesian coordinate system, as indicated in FIG. 1 by way of example by the arrows 122.

In embodiments, the second direction alternatively can be an out-of-plane direction out of the plane spanned by the second actuation layer 104.

The out-of-plane direction can be a vertical direction perpendicular to the plane spanned by the second actuation layer 104.

For example, the actuators 116 of the second actuation layer 104 can be configured to move (e.g., to translate) the third frame 112 and the fourth frame 114 with respect to each other in the second direction perpendicular to the plane spanned by the second actuation layer 104, e.g., in the second direction parallel to the third axis (e.g., z-axis) of the Cartesian coordinate system, as indicated in FIG. 1 by way of example by arrows 124.

Further or alternatively, the out-of-plane direction can be a rotation of the third frame and the fourth frame with respect to each other around an axis parallel to the plane spanned by the second actuation layer 104.

For example, the actuators 116 of the second actuation layer 104 can be configured to rotate the third frame 112 and the fourth frame 114 with respect to each other around an axis parallel to the plane spanned by the second actuation layer 104, for example, around the axis 126 parallel to the second axis (e.g., y-axis) of the Cartesian coordinate system as indicated in FIG. 1 by way of example by arrow 128.

In embodiments, the plurality of actuators 110 of the first actuation layer 102 and/or the plurality of actuators 116 of the second actuation layer 104 can be formed by two groups of actuators, wherein the two groups of actuators can be adapted to rotate the first frame 102 and/or the second frame 104 with respect to each other.

In embodiments, the plurality of actuators 110, 116 of the first actuation layer 102 and/or second actuation layer 104 can be bending actuators, such as L-NED actuators for in-plane displacements or V-NED actuators for out-of-plane displacements.

The plurality of actuators 110, 116 can be mechanically connected between the corresponding frames of the first actuation layer 102 and the second actuation layer 104. In FIG. 1 two bending actuators 110, 116 per actuation layer 102, 104 are indicated by way of example. However, embodiments are not limited to such implementations, rather, a multitude of bending actuators, such as 4, 6, 8, 10, 12, 20, 40, 60 or even more bending actuators can be connected in parallel (or serially and in parallel) between the corresponding frames of the first actuation layer 102 and the second actuation layer 104.

In embodiments, the fourth frame 114 of the second actuation layer 104 and the second frame 108 of the first actuation layer 102 can be mechanically connected to each other, for example, by means of a spacer, such that the actuators 116 of the second actuation layer 104 can perform the in-plane translation and/or the out-or-plane translation or tilting.

Further, the first actuation layer 102 and the second actuation layer 104 can be stacked on each other.

In FIG. 1 it is exemplarily assumed that the first frame 106 of the first actuation layer 102 is a static or fixed frame (e.g. not moveable), for example, attached to a reference system, such that the actuators 110 of the first actuation layer move (e.g., translate) the second frame 108 with respect to first frame 106 in the first direction. Since the second frame 108 of the first actuation layer 102 and the fourth frame 114 of the second actuation layer 104 are mechanically connected to each other, the second actuation layer 104 experiences the movement in the first direction induced by the actuators 110 of the first actuation layer 102. The actuators 116 of the second actuation layer 104 move (e.g., translate, or tilt) the third frame 112 with respect to the fourth frame 114, which is mechanically connected to the second frame 108 of the first actuation layer 102, such that the third frame 112 experiences the movement in the second direction induced by the actuators 116 of the second actuation layer 104 and also the movement in the first direction induced by the actuators 110 of the first actuation layer 102.

In embodiments, the platform 100 provides a multidirectional movement of an object, e.g. a lens located in the center, fixed to it. Such a platform 100 can be used, for example, in autofocus and image stabilizer systems, (bio) medical specimen preparation and more.

Multidirectional movement implies horizontal (in-plane), vertical (out-of-plane) and/or tilting movements. These movement directions can be established through dedicated actuation layers stacked on each other. The actuators can be shaped in such a way that the object to be moved (e.g. the lens mentioned above) is fully accessible, i.e. the optical path is free for use of the lens. Therefore, the actuators can be placed around the part to be moved.

Subsequently, embodiments of the platform 100 are described in further detail.

In-Plane (e.g., Horizontal) Translation of the Platform

The in-plane displacement along one axis (e.g., the first axis (e.g., x-axis) or second axis (e.g., y-axis) of the Cartesian coordinate system shown in FIG. 1) can be achieved by using bending actuators (for example, L-NED actuators). A set of actuators (two or more) permits the junction between a static frame and the moving frame (e.g., moving platform), as shown in FIGS. 2a to 2c.

Figure 2A:
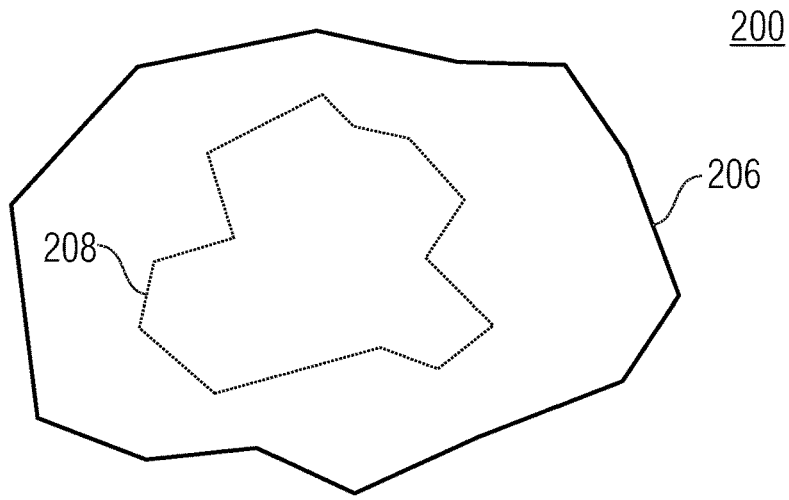
FIG. 2a shows a schematic view of a platform with a first frame and a second frame.
Figure 2B:
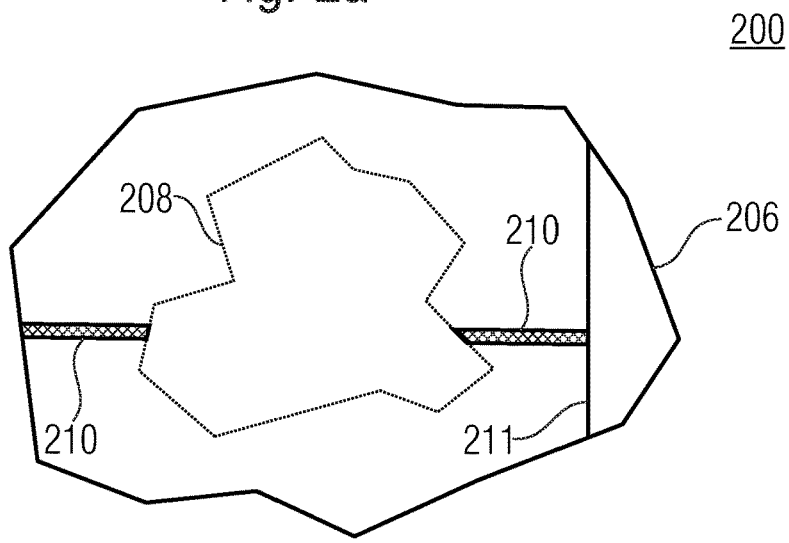
FIG. 2b shows a schematic view of the platform with the first frame, the second frame and bending actuators mechanically connected between the first frame and the second frame.
Figure 2C:
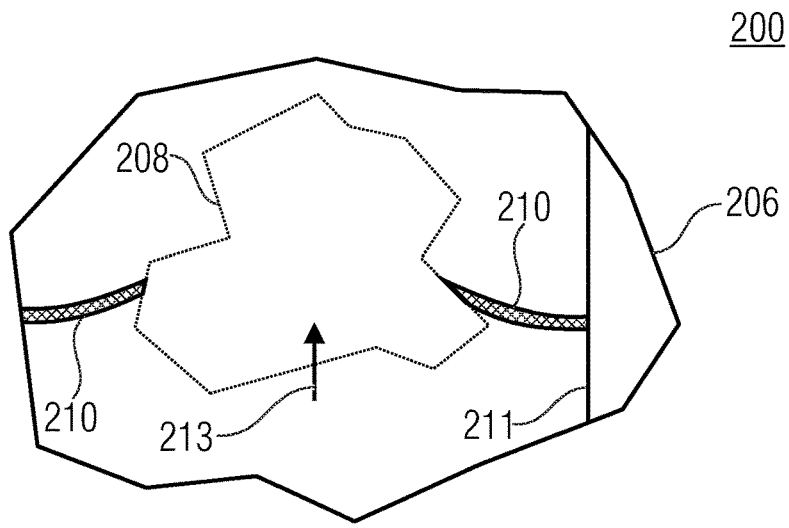
FIG. 2c shows a schematic view of the platform with the first frame, the second frame and the bending actuators, wherein the second frame is displaced with respect to the first frame in the first direction by the bending actuators.

In detail, FIG. 2a shows a schematic view of a platform 200 with a first frame 206 and a second frame 208. FIG. 2b shows a schematic view of the platform 200 with the first frame 206, the second frame 208 and bending actuators 210 mechanically connected between the first frame 206 and the second frame 208. Further, as shown in FIG. 2b, an auxiliary structure 211 can be used for mechanically connecting one of the actuators 210 to the first frame 206. The actuators 210 can be configured to displace the second frame 208 with respect to the first frame 206 in a first direction 213 (e.g., along one axis, such as the x-axis or y-axis of the Cartesian coordinate system shown in FIG. 1). FIG. 2c shows a schematic view of the platform 200 with the first frame 206, the second frame 208 and the bending actuators 210, wherein the second frame 208 is displaced with respect to the first frame 206 in the first direction 213 by the bending actuators 210.

The actuators 210 can be oriented in a direction close to the perpendicular to the displacement axes 213. The bending of each actuator 210 permits the translation of the moving frame (e.g., moving platform) 208 in the desired direction. The actuator 210 doesn't have to be straight. It can take different shape as long as it permits to join the static frame 206 with the moving frame (e.g., moving platform) 208. A pre-deformed shape may allow for compensation of parasitic movement (e.g. shortening due to bending). If useful, the actuators may be folded, i.e. serial arranged, to increase deflection.

In order to improve the dynamic response of the system, the actuators 210 can fully cover the area (e.g., surface), or least 99%, 95%, 90%, 80% or 70% of the area, located between the static frame and the moving frame (e.g., moving platform) 208. A correct distance between the actuator 210 can be evaluated in order to increase or even maximize the density of actuators 210 and insure their non-contact, as shown in FIGS. 3a to 3c.

Figure 3A:
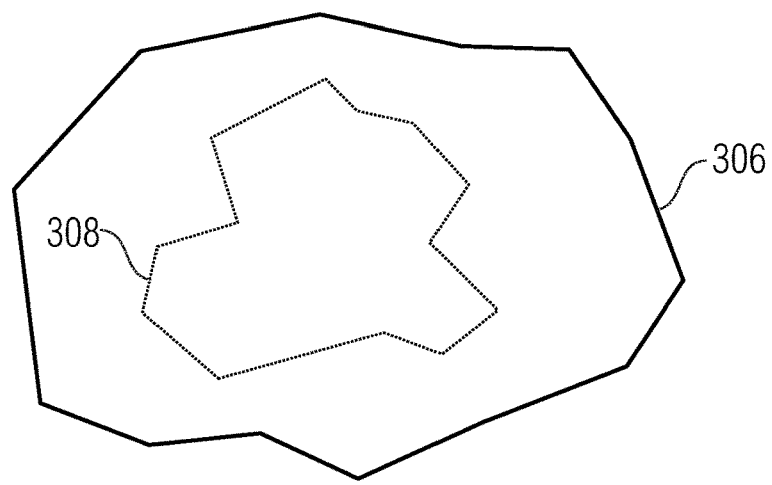
FIG. 3a shows a schematic view of a platform with a first frame and a second frame.
Figure 3B:
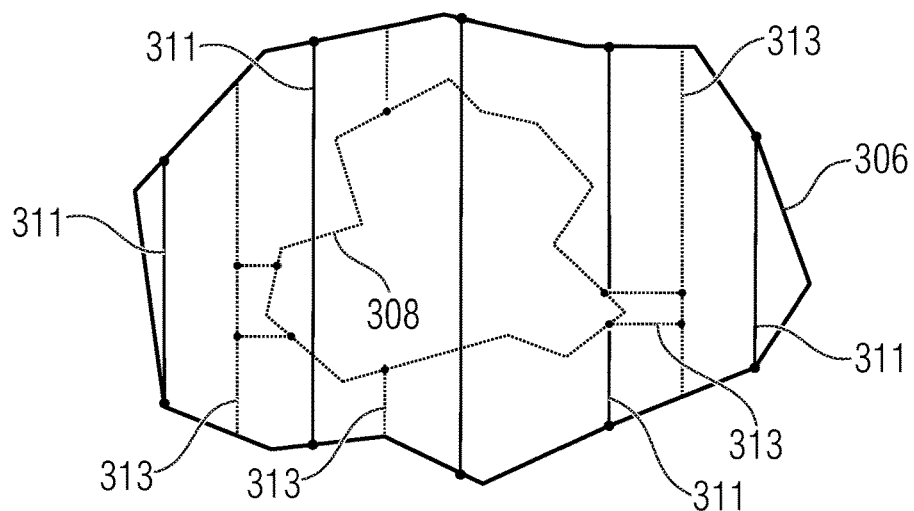
FIG. 3b shows a schematic view of the platform with the first frame, the second frame, first auxiliary frame structures mechanically connected to the first frame and second auxiliary frame structures mechanically connected to the second frame.
Figure 3C:
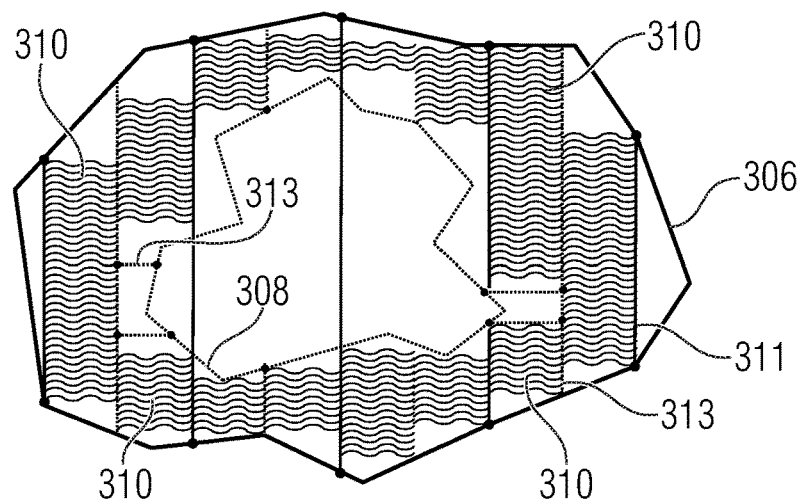
FIG. 3c shows a schematic view of the platform shown in FIG. 3b with a plurality of actuators mechanically connected between the first auxiliary frame structures and the second auxiliary frame structures.

In detail, FIG. 3a shows a schematic view of a platform 300 with a first frame 306 and a second frame 308. FIG. 3b shows a schematic view of the platform 300 with the first frame 306, the second frame 308, first auxiliary frame structures 311 mechanically connected to the first frame 306 and second auxiliary frame structures 313 mechanically connected to the second frame 308. The first auxiliary frame structures 311 can be, for example, beams, which can be arranged, e.g., parallel to the first direction (e.g., parallel to the first axis (e.g., x-axis) or second axis (y-axis) of the Cartesian coordinate system shown in FIG. 1) in which the second frame 308 is to be displaced. The second auxiliary frame structures 313 can be, for example, springs or a combination of beams and springs. FIG. 3c shows a schematic view of the platform 300 shown in FIG. 3b with a plurality of actuators 310 mechanically connected between the first auxiliary frame structures 311 and the second auxiliary frame structures 313.

In other words, a set of inter-digitized beams 311 may therefore be designed in order to increase the facing surface of the static frame 306 with the moving frame (e.g., moving platform) 308. The actuators 310 can be positioned between those beams 311 to generate the displacement.

In order to generate a correct translation of the moving frame (e.g., moving platform) 308 in the in-plane direction (e.g., first direction), the amplitude of the tip displacement of the different actuators 310 in place should be similar or even identical. This doesn't impose a constant length for the actuators 310.

Further, springs 313 can be carefully designed and placed in order to transfer the motion of the actuator 310 to the moving frame (e.g., moving platform) 308 without over constraining the system.

In-Plane (e.g., Vertical) Translation of the Platform

Figure 4A:
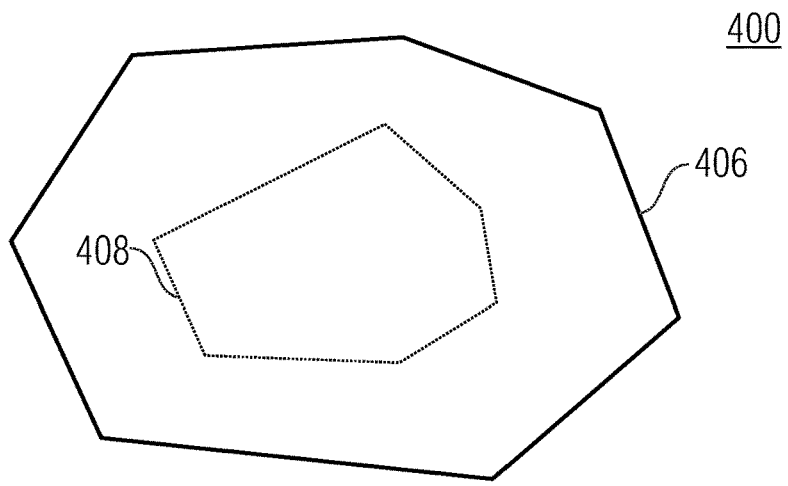
FIG. 4a shows a schematic view of a platform with a first frame and a second frame.
Figure 4B:
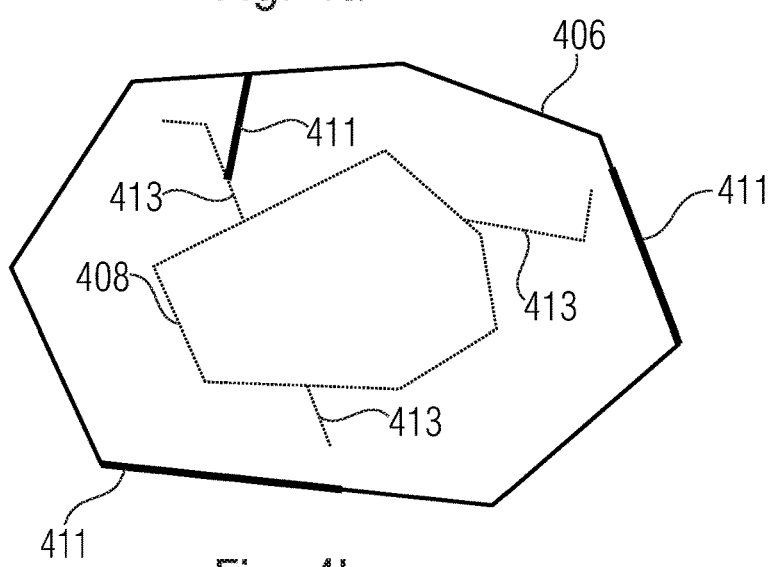
FIG. 4b shows a schematic view of the platform with the first frame, the second frame, first auxiliary frame structures mechanically connected to the first frame and second auxiliary frame structures mechanically connected to the second frame.
Figure 4C:
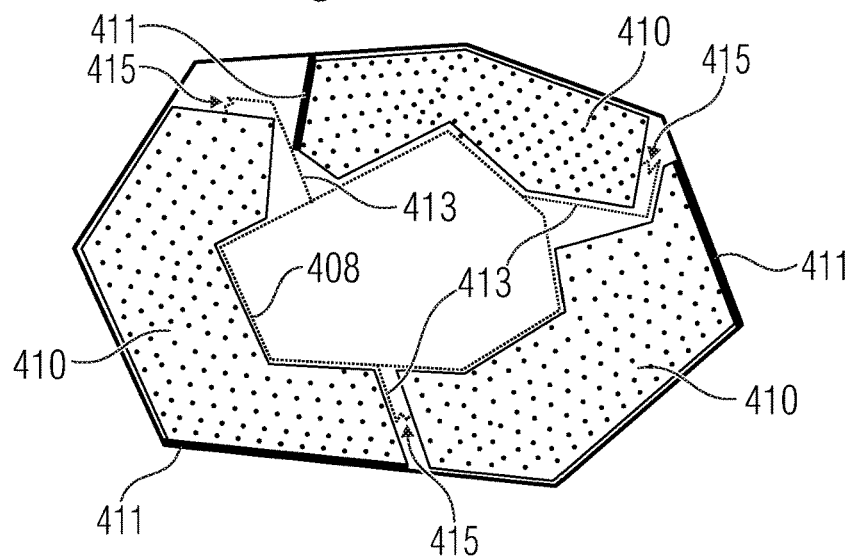
FIG. 4c shows a schematic view of the platform shown in FIG. 4b with a plurality of actuators mechanically connected between the first auxiliary frame structures and the second auxiliary frame structures.

The out-of-plane displacement, in the normal direction to the layer in which the actuators 410 are processed, can be achieved by using bending actuators (for example, V-NED actuators), as shown in FIGS. 4a to 4c.

In detail, FIG. 4a shows a schematic view of a platform 400 with a first frame 406 and a second frame 408. FIG. 4b shows a schematic view of the platform 400 with the first frame 406, the second frame 408, first auxiliary frame structures 411 mechanically connected to the first frame 406 and second auxiliary frame structures 413 mechanically connected to the second frame 408. The first auxiliary frame structures 411 can be, for example, beams. The second auxiliary frame structures 413 can be, for example, springs or a combination of beams and springs. FIG. 4c shows a schematic view of the platform 400 shown in FIG. 4b with a plurality of actuators 410 mechanically connected between the first auxiliary frame structures 411 and the second auxiliary frame structures 413. Further, in FIG. 4c it is indicated that second auxiliary frame structures 413 may comprise springs 415 for mechanically connecting to the actuators 410.

In other words, a set of actuators 410 (two or more) permits the junction between a static frame 406 and the moving frame (e.g., moving platform) 408. The actuators 410 can be oriented in-plane, i.e. along the direction to the displacement axes. The bending of each actuator 410 permits the translation of the moving frame (e.g., moving platform) 408 in the desired direction.

In order to improve the dynamic response of the system, the actuators 410 can fully cover the surface (or area), or least 99%, 95%, 90%, 80% or 70% of the area, located between the static frame 406 and the moving frame (e.g., moving platform) 408. This allows the use of non-rectangular actuators. In order to achieve a correct bending behavior of one actuator 410, its contact lines, to the static frame 406 and to the moving frame (e.g., moving platform) 408 (or spring entity), can be, for example, straight and parallel to each other.

To maximize the number of actuators 410 and increase system stiffness beneficially the actuators can be arranged in a spoke configuration (see FIG. 4c). This also distributes the forces applied to the moveable objects frame and allows for rotational movement (about z-axis, extra DOF).

In order to generate a correct translation of the moving frame (e.g., moving platform) 408 in the out of plane direction, the amplitude of the tip displacement of the different actuators in place can be similar or even identical.

Springs can 415, 413 be carefully designed and placed in order to transfer the motion of the actuator 410 to the moving frame (e.g., moving platform) 408 without over constraining the system.

A set of extra beams 411 can also be designed in order to create parallel facing edges of the static frame 406 with the moving frame (e.g., moving platform) 408. The actuators 410 can be positioned between those beams to generate the displacement.

Tilting of the Platform

The tilting of the moving frame (or moving platform) along one axis can be achieved by using bending actuators (for example, VNED actuators). The configuration is similar than the one permitting the vertical translation of the moving frame (or moving platform). However, to achieve this motion, the amplitude of the tip displacement of the different actuators in place should be different.

Combining Different Axes of Displacement/Rotation

A translation of a moving frame (e.g., moving platform) along two horizontal axes can be achieved by setting up the 2nd displacement axis in the moving frame (e.g., moving platform) location of the 1st displacement axes. This implementation can be set up in one plane or by stacking the active layers one over another.

A tilting of the moving frame (e.g., moving platform) along two non-parallel axes, excluding the normal axis to the moving frame (e.g., moving platform), can be achieved in two different manners. First, using a minimum of three bending actuators (e.g., V-NED actuators) in a unique processed layer or two actuators and a fix point, link to the frame via a spring connection. Second, implementing a 2nd tilting axes in the platform location of the 1st tilting axes.

Combining an in-plane moving frame (e.g., moving platform) with an out-of-plane moving frame (e.g., moving platform) may involve the second entity being located in the moving frame (e.g., moving platform) of the first entity or, if stacked above the first entity, having an out-of-plane direction oriented in the half space generated by the actuation plane that is not containing the 1st entity. In case of a useful displacement in the second half space, a set of spacers can be created between the two layers.

Stacking multiple layers can authorize the free displacement of each of them without contact between each other, as well as with the "object" moved by the system.

Stacking multiple layers can reverse the logic of fixed frame and moving frame (e.g., moving platform). The moving frame (e.g., moving platform) can perfectly be around the fixed frame that would in that case be at the center of the structure.

Connection Between Levels

In order to achieve a combination of displacements (translation and/or rotation), connection can be set up in order to permit the transfer of motion (mechanical) as well as the supply in energy (electrical).

The mechanical connection can be done, in the case of extra degree of freedom (DOF) integrated in the platform of the actuator delivering the 1st DOF motion, by simple contact between the areas, resulting from the patterning of the original bulk material, in agreement with the design. It can also be allowed by the bonding of processed layers, each of which is achieving one specific movement direction.

The electrical connection can be achieved in a similar manner than the one presented above. The wiring of each layer with the external frame (static) can also be an option. In this case, the displacement of the structure shouldn't affect the electric wires. In the same way, the electric wire should affect the mechanical behavior of the system.

In case of high voltage requirement in order to supply the system in energy, a charge pump, also known as DC-DC converter can be integrated to supply that levels up voltage from a lower supplied voltage.

Further Embodiments

Figure 5A:
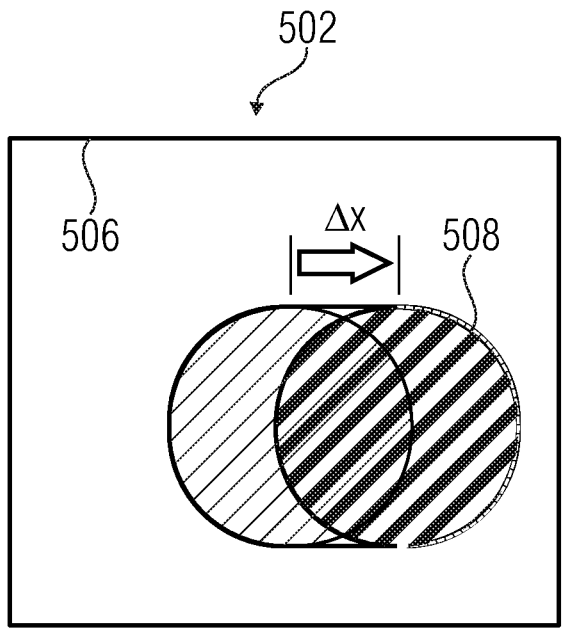
FIG. 5a shows a schematic view of the first actuation layer and a displacement of the moving frame with respect to the static frame in a first direction.
Figure 5B:
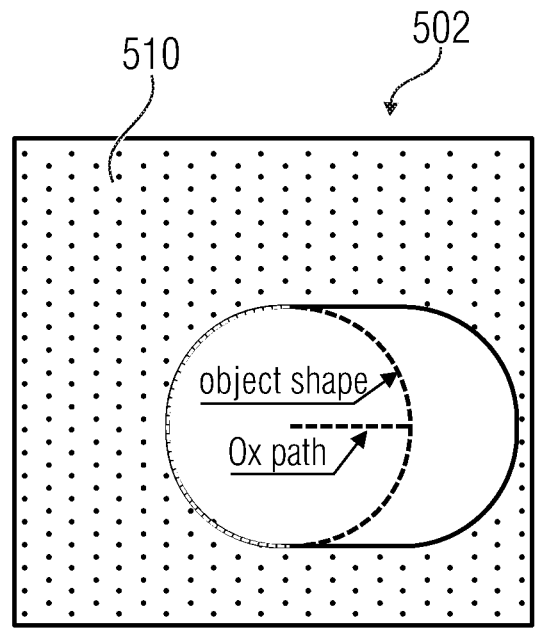
FIG. 5b shows a schematic view of the first actuation layer shown in FIG. 5a together with an area between the static frame and the moving frame that can be used for or dedicated to the actuators of the first actuation layer.

FIG. 5a shows a schematic view of the first actuation layer 502 and a displacement of the moving frame 508 with respect to the static frame 506 in a first direction (e.g., x-direction), wherein FIG. 5b shows a schematic view of the first actuation layer 502 shown in FIG. 5a together with an area 510 between the static frame 506 and the moving frame 508 that can be used for or dedicated to the actuators of the first actuation layer 502. As shown in FIG. 5b, due to the displacement of the moving frame 508 with respect to the static frame 506 in the first direction (e.g., x-direction), only a limited area between the static frame 506 and the moving frame 508 can be used for the actuators.

Figure 5C:
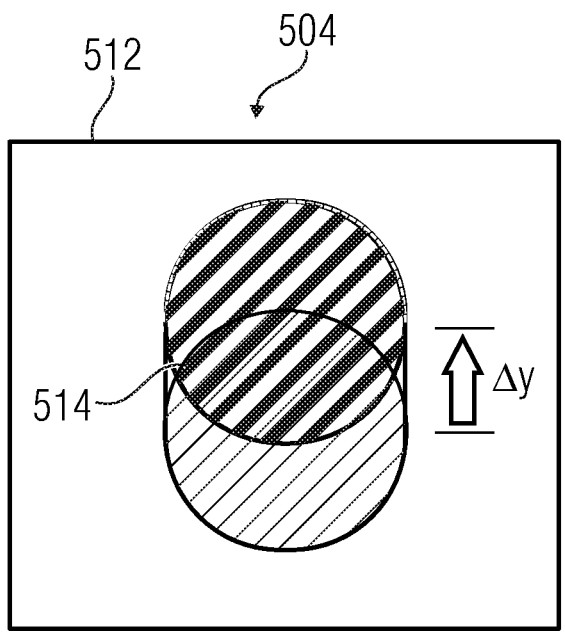
FIG. 5c shows a schematic view of the second actuation layer and a displacement of the moving frame with respect to the static frame in a second direction.
Figure 5D:
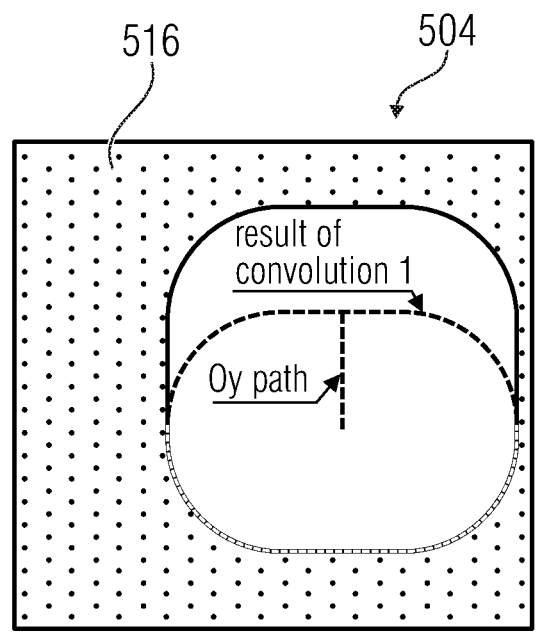
FIG. 5d shows a schematic view of the second actuation layer shown in FIG. 5c together with an area between the static frame and the moving frame that can be used for or dedicated to the actuators of the second actuation layer.

FIG. 5c shows a schematic view of the second actuation layer 504 and a displacement of the moving frame 514 with respect to the static frame 512 in a second direction (e.g., y-direction), wherein FIG. 5d shows a schematic view of the second actuation layer 504 shown in FIG. 5c together with an area 516 between the static frame 512 and the moving frame 514 that can be used for or dedicated to the actuators of the second actuation layer 504. As shown in FIG. 5d, due to the displacement of the moving frame in the first direction (e.g., x-direction) and the second direction (e.g., y-direction), only a limited area 516 between the static frame 512 and the moving frame 514 can be used for the actuators.

In other words, the problematic of space consumption when working over combined x- and y-translation layers is shown in FIGS. 5a to 5d. If only considering one axis (Ox), the area covered by the object during its displacement cannot be filled with actuators. If adding a second layer (Oy), if the object is thicker than the actuation layers or may involve free space above or under it in respect of its application (such as an optical path), the area covered by the object during its Oy displacement has to be free as well as the area covered by the Oy displacement. If the object is connected to the first layer itself connected to the second layer, then, for the first layer, the area that may be kept free is the convolution product of the object shape by the displacement path Delta x, and, for the second layer, the area may to be kept free is the convolution product of the previously defined area by its displacement path Delta y.

Figure 6:
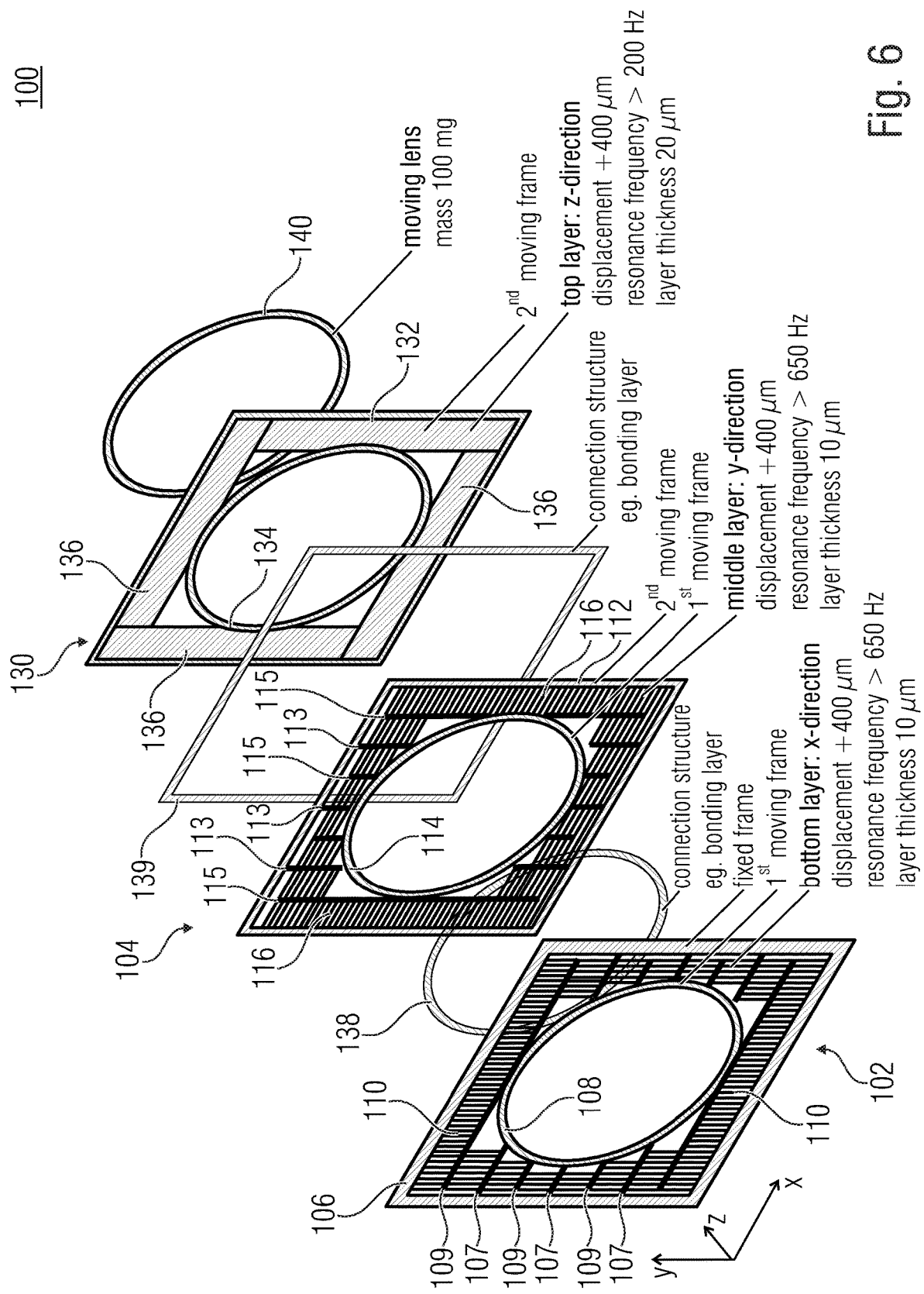
FIG. 6 shows a schematic, exploded view of a platform with a first actuation layer, a second actuation layer and a third actuation layer, according to an embodiment.

FIG. 6 shows a schematic, exploded view of a platform 100 with a first actuation layer 102, a second actuation layer 104 and a third actuation layer 130.

The first actuation layer (or bottom layer) 102 can comprise a first frame (e.g., static or fixed frame) 106, a second frame (e.g., moveable frame) 108 and a plurality of actuators 110 connected between the first frame 106 and the second frame 108, wherein the plurality of actuators 110 are adapted to move the second frame 108 with respect to the first frame 106 in a first direction, wherein the first direction can be an in-plane direction, such as a x-direction. The first actuation layer 102 may have, for example, a displacement of +400 µm, a resonance frequency greater than 650 Hz, and a layer thickness of 10 µm. As exemplarily indicated in FIG. 6, the first actuation layer 102 can optionally comprise first auxiliary frame structures 107 mechanically connected to the first frame 106 and second auxiliary frame structures 109 mechanically connected to the second frame 108. The first auxiliary frame structures 107 can be, for example, beams, which can be arranged, e.g., parallel to the first direction (e.g., x-axis) in which the second frame 108 is displaced. The second auxiliary frame structures 109 can be, for example, springs or a combination of beams and springs.

The second actuation layer (middle layer) 104 can comprise a third frame (e.g., a moving frame) 112, a fourth frame (e.g., a moving frame) 114 and a plurality of actuators 116 connected between the third frame 112 and the fourth frame 114, wherein the plurality of actuators 116 are adapted to move the third frame 112 with respect to the fourth frame 114 in a second direction, wherein the second direction can be an in-plane direction, such as a y-direction. The second actuation layer 104 may have, for example, a displacement of +400 µm, a resonance frequency greater than 650 Hz, and a layer thickness of 10 µm. As exemplarily indicated in FIG. 6, the second actuation layer 104 can optionally comprise third auxiliary frame structures 113 mechanically connected to the third frame 112 and fourth auxiliary frame structures 115 mechanically connected to the fourth frame 114. The third auxiliary frame structures 113 can be, for example, springs or a combination of beams and springs. The fourth auxiliary frame structures 115 can be, for example, beams, which can be arranged, e.g., parallel to the second direction (e.g., y-axis) in which the third frame 112 is to be displaced.

The third actuation layer (or top layer) 130 can comprise a fifth frame (e.g., moving frame) 132 and a sixth frame (e.g., moving frame) 134 and a plurality of actuators 136 connected between the fifth frame 132 and the sixth frame 134, wherein the plurality of actuators 136 are adapted to move the sixth frame 134 with respect to the fifth frame 132 in a third direction, wherein the third direction can be an out-of-plane direction, such as a z-direction or a tilting around a x-direction and/or y-direction. The third actuation layer 130 may have, for example, a displacement of +400 µm, a resonance frequency greater than 650 Hz, and a layer thickness of 20 µm.

As indicated in FIG. 6, an object 140, such as a moving lens having a mass of, for example, 100 mg, can be attached to the platform 100, or more precisely, to the sixth frame 134.

The second frame 108 and the fourth frame 114 can be mechanically connected to each other via a connection structure 138, such as a spacer or bonding layer, wherein the third frame 112 and the fifth frame 132 can be connected to each other via a connection structure 139, such as a spacer or bonding layer.

Figure 7:
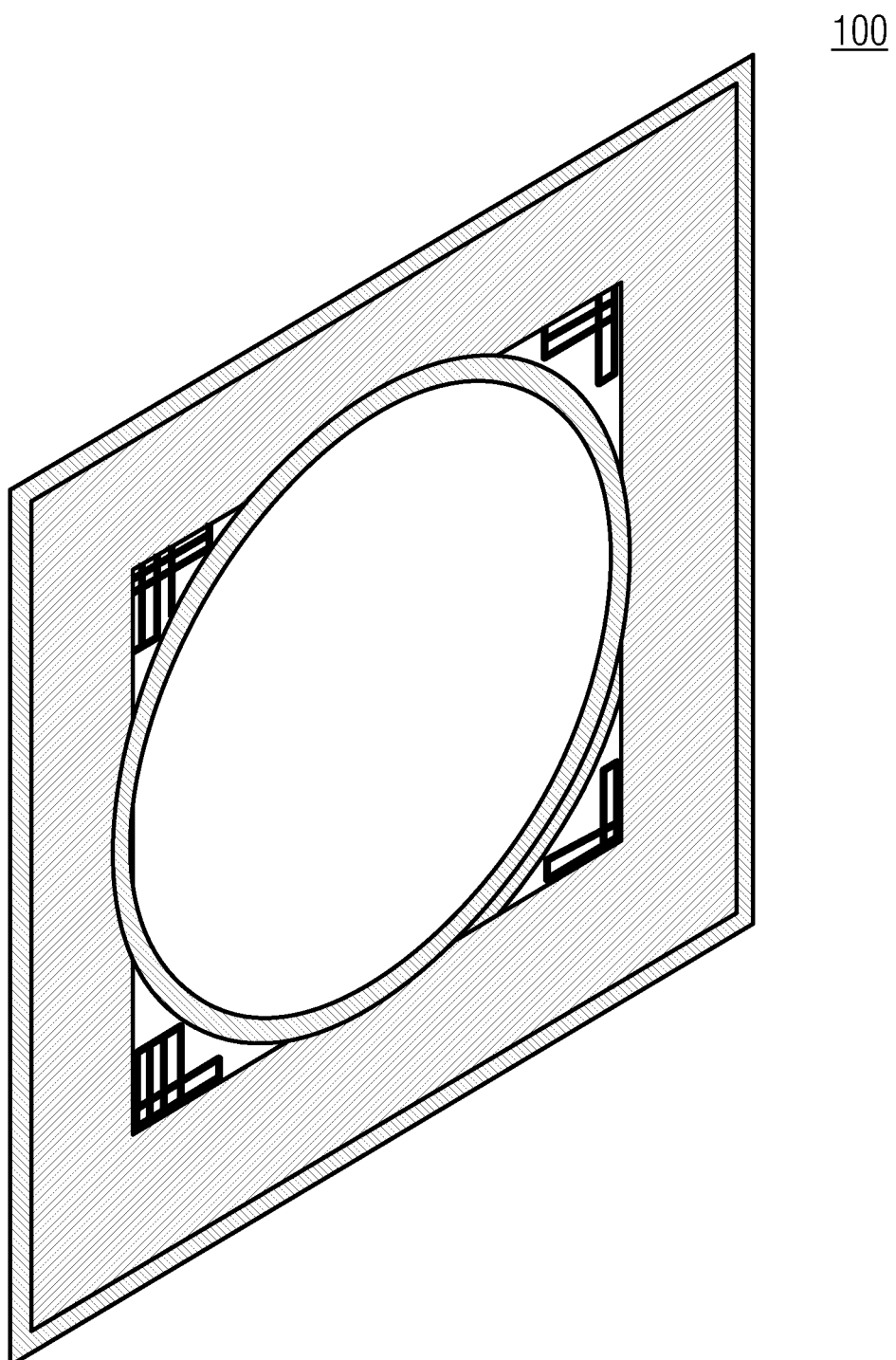
FIG. 7 shows a schematic, non-exploded view of the platform shown in FIG. 6.

FIG. 7 shows a schematic, non-exploded view of the platform 100 shown in FIG. 6.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods may be performed by any hardware apparatus.

The apparatus described herein may be implemented using a hardware apparatus, or using a computer, or using a combination of a hardware apparatus and a computer.

The apparatus described herein, or any components of the apparatus described herein, may be implemented at least partially in hardware and/or in software.

The methods described herein may be performed using a hardware apparatus, or using a computer, or using a combination of a hardware apparatus and a computer.

The methods described herein, or any components of the apparatus described herein, may be performed at least partially by hardware and/or by software.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A platform, comprising:
a first actuation layer comprising a first frame, a second frame and a plurality of first actuators connected between the first frame and the second frame, wherein the plurality of first actuators are adapted to move the first frame and the second frame with respect to each other in a first direction;
a second actuation layer comprising a third frame, a fourth frame and a plurality of second actuators connected between the third frame and the fourth frame, wherein the plurality of second actuators are adapted to move the third frame and the fourth frame with respect to each other in a second direction, different from the first direction;
wherein the fourth frame of the second actuation layer and the second frame of the first actuation layer are mechanically connected to each other;
wherein the first actuation layer comprises first auxiliary frame structures mechanically connected to the first frame and second auxiliary frame structures mechanically connected to the second frame, wherein the plurality of first actuators are mechanically connected between the first auxiliary frame structures and the second auxiliary frame structures, and/or
wherein the second actuation layer comprises third auxiliary frame structures mechanically connected to the third frame and fourth auxiliary frame structures mechanically connected to the fourth frame, wherein the plurality of second actuators are mechanically connected between the third auxiliary frame structures and the fourth auxiliary frame structures, wherein the plurality of first actuators of the first actuation layer are formed by two groups of actuators, wherein the two groups of actuators are adapted to rotate the first frame and the second frame with respect to each other, and/or wherein the plurality of second actuators of the second actuation layer are formed by two groups of actuators, wherein the two groups of actuators are adapted to rotate the third frame and the fourth frame with respect to each other.

2. The platform according to claim 1,
wherein the first direction is an in-plane direction in-plane a plane spanned by the first actuation layer, and/or
wherein the second direction is an in-plane direction in-plane a plane spanned by the second actuation layer.

3. The platform according to claim 2,
wherein the in-plane direction is a direction parallel to the plane spanned by the first actuation layer or the second actuation layer, respectively.

4. The platform according to claim 1,
wherein the second direction is an out-of-plane direction out of a plane spanned by the second actuation layer.

5. The platform according to claim 4,
wherein the out-of-plane direction is a rotation of the third frame and the fourth frame with respect to each other, and/or
wherein the out-of-plane direction is a vertical translation of the of the third frame and the fourth frame with respect to each other.

6. The platform according to claim 1,
wherein the first frame is a static frame, and/or
wherein the second frame, the third frame and the fourth frame are moveable frames.

7. The platform according to claim 1,
wherein the first, second, third and fourth auxiliary frame structures comprise beams, springs or a combination thereof.

8. The platform according to claim 1, wherein the platform comprises:
a third actuation layer comprising a fifth frame, a sixth frame and a plurality of third actuators connected between the fifth frame and the sixth frame, wherein the plurality of third actuators are adapted to move the fifth frame and the sixth frame with respect to each other in a third direction, different from the first direction and the second direction;
wherein the fifth frame of the third actuation layer is mechanically connected to the third frame of the second actuation layer.

9. The platform according to claim 8,
wherein the plurality of third actuators of the third actuation layer are nanoscopic electrostatic drive actuators.

10. The platform according to claim 8,
wherein the third direction is an out-of-plane direction out of a plane spanned by the third actuation layer.

11. The platform according to claim 10,
wherein the out-of-plane direction is a rotation of the fifth frame and the sixth frame with respect to each other, and/or
wherein the out-of-plane direction is a vertical translation of the fifth frame and the sixth frame with respect to each other.

12. The platform according to claim 8,
wherein the fifth frame and the sixth frame are moveable frames.

13. The platform according to claim 1,
wherein a moveable object is attached to the platform.

* * * * *